(12) United States Patent
Masuzawa et al.

(10) Patent No.: US 10,103,641 B2
(45) Date of Patent: Oct. 16, 2018

(54) POWER CONVERTER WITH PARASITIC INDUCTANCE REDUCED BY COUNTER CONDUCTOR

(71) Applicant: DENSO CORPORATION, Kariya, Aichi-pref. (JP)

(72) Inventors: Takashi Masuzawa, Kariya (JP); Hiroshi Taki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/361,206

(22) Filed: Nov. 25, 2016

(65) Prior Publication Data

US 2017/0155337 A1    Jun. 1, 2017

(30) Foreign Application Priority Data

Nov. 27, 2015    (JP) .................................. 2015-232174

(51) Int. Cl.
| | |
|---|---|
| *H02M 7/00* | (2006.01) |
| *H02M 7/48* | (2007.01) |
| *H05K 1/02* | (2006.01) |
| *H05K 1/18* | (2006.01) |

(52) U.S. Cl.
CPC ............ *H02M 7/003* (2013.01); *H02M 7/48* (2013.01); *H05K 1/0216* (2013.01); *H05K 1/181* (2013.01); *H05K 2201/10378* (2013.01)

(58) Field of Classification Search
CPC ... H02M 7/003; H02M 1/44; H02M 2001/346
See application file for complete search history.

(56) References Cited

U.S. PATENT DOCUMENTS

| 2009/0040724 | A1* | 2/2009 | Nishikimi | .......... H05K 7/20927 361/699 |
|---|---|---|---|---|
| 2012/0300522 | A1* | 11/2012 | Tokuyama | ............ H01L 25/072 363/131 |
| 2016/0181947 | A1* | 6/2016 | Raju | .................... H02M 7/5387 363/140 |
| 2016/0336268 | A1* | 11/2016 | Kamikura | ............... H01L 25/07 |

FOREIGN PATENT DOCUMENTS

JP    2008-306872 A    12/2008

\* cited by examiner

*Primary Examiner* — Harry Behm
(74) *Attorney, Agent, or Firm* — Oliff PLC

(57) ABSTRACT

An electric power converter includes a positive and a negative electrode terminals being disposed parallel and adjacent to each other, a positive electrode side switching device connected to the positive electrode terminal, a negative electrode side switching device connected to the negative electrode terminal, an output terminal connected to a connection point between the positive and the negative electrode side switching devices, and a counter conductor facing at least a portion of the positive electrode terminal and at least a portion of the negative electrode terminal in a height direction, the height direction being a direction perpendicular to both an aligned direction and a protruding direction of the positive and the negative electrode terminals. The counter conductor is disposed along a current path of an alternating current flowing through the positive electrode terminal, the positive electrode side switching device, the negative electrode side switching device, and the negative electrode terminal.

7 Claims, 22 Drawing Sheets

POWER CONVERTER WITH PARASITIC INDUCTANCE REDUCED BY COUNTER CONDUCTOR

CROSS-REFERENCE TO RELATED APPLICATION

This application is based on and claims the benefit of priority from earlier Japanese Patent Application No. 2015-232174 filed Nov. 27, 2015, the description of which is incorporated herein by reference.

TECHNICAL FIELD

The present disclosure relates to an electric power converter having a switching device.

BACKGROUND

An electric power converter such as an inverter mounted on an electric vehicle or a hybrid vehicle or the like, for example, is configured to perform power conversion between direct current power and alternating current power by turning on and off a plurality of switching devices.

In a switching circuit of such an electric power converter, a surge voltage is generated due to inductance parasitic on the circuit along with an on-off operation of the switching device.

In order to suppress the surge voltage from being generated, a technique of reducing the parasitic inductance is proposed.

A structure of disposing connecting portions of respective positive electrode and the negative electrode (hereinafter, referred to as a positive electrode terminal and a negative electrode terminal, respectively) externally to positions opposing a connecting portion of an output electrode (hereinafter, referred to as an output terminal) externally in parallel in a state of being adjacent to each other is disclosed in Japanese Patent Application Laid-Open Publication No. 2008-306872.

With such a configuration, circulating magnetic fluxes that are generated around various parts of a current route are in a state of canceling each other so that the parasitic inductance of the circuit is suppressed from being generated.

However, in the above configuration, it is necessary to provide sufficient spaces between the positive electrode terminal and the output terminal, and between the negative electrode terminal and the output terminal, respectively.

That is, it is necessary to keep sufficient distances between the positive electrode terminal and the output terminal, and between the negative electrode terminal and the output terminal in order to achieve sufficient electrical insulations.

However, a problem that is difficult to obtain the effect of reducing the parasitic inductance is likely to occur.

Further, when positional relationships between the positive electrode terminal, the negative electrode terminal, and the output terminal are defined in predetermined positional relationships, the wiring flexibility may be decreased.

SUMMARY

An embodiment provides an electric power converter capable of effectively suppressing parasitic inductance from being generated.

In an electric power converter according to a first aspect, the electric power converter includes a positive electrode terminal and a negative electrode terminal being disposed parallel and adjacent to each other, a positive electrode side switching device connected to the positive electrode terminal, a negative electrode side switching device connected to the negative electrode terminal, and an output terminal connected to a connection point between the positive electrode side switching device and the negative electrode side switching device.

The electric power converter further includes a counter conductor facing at least a portion of the positive electrode terminal and at least a portion of the negative electrode terminal in a height direction, the height direction being a direction perpendicular to both an aligned direction and a protruding direction of the positive electrode terminal and the negative electrode terminal.

The counter conductor is disposed along a current path of an alternating current flowing through the positive electrode terminal, the positive electrode side switching device, the negative electrode side switching device, and the negative electrode terminal.

The electric power converter includes the above-mentioned counter conductor.

Then, the counter conductor is disposed along a current path of an alternating current flowing through the positive electrode terminal, the positive electrode side switching device, the negative electrode side switching device, and the negative electrode terminal.

Thus, it is possible to suppress the parasitic inductance from being generated in the current path.

That is, since the counter conductor is disposed as described above, an induced current flows in the counter conductor so as to cancel a magnetic flux caused by the alternating current flowing in the alternating current path.

Thereby, it is possible to suppress the parasitic inductance from being generated in the alternating current path.

Further, it is possible to reduce high-frequency magnetic flux caused by the alternating current flowing in the alternating current path.

Therefore, it becomes easy to prevent electromagnetic noise from influencing on electronic components in or around the electric power converter.

Then, since the counter conductor is different from the positive electrode terminal, the negative electrode terminal, and the output terminal, the counter conductor may be disposed in a state where the distance between the positive electrode terminal and the negative electrode terminal is reduced.

Further, by using the counter conductor, it is not necessary to devise the positional relationship between the positive electrode terminal, the negative electrode terminal, and output terminal for suppressing the parasitic inductance from being generated.

Therefore, it is possible to obtain design flexibility of the electric power converter.

As described above, according to the above aspect, it is possible to provide an electric power converter capable of effectively suppressing parasitic inductance from being generated.

DETAILED DESCRIPTION OF THE PREFERRED EMBODIMENTS

[First Embodiment]

An embodiment of an electric power converter will be described with reference to FIGS. 1 to 7.

Figure 1:
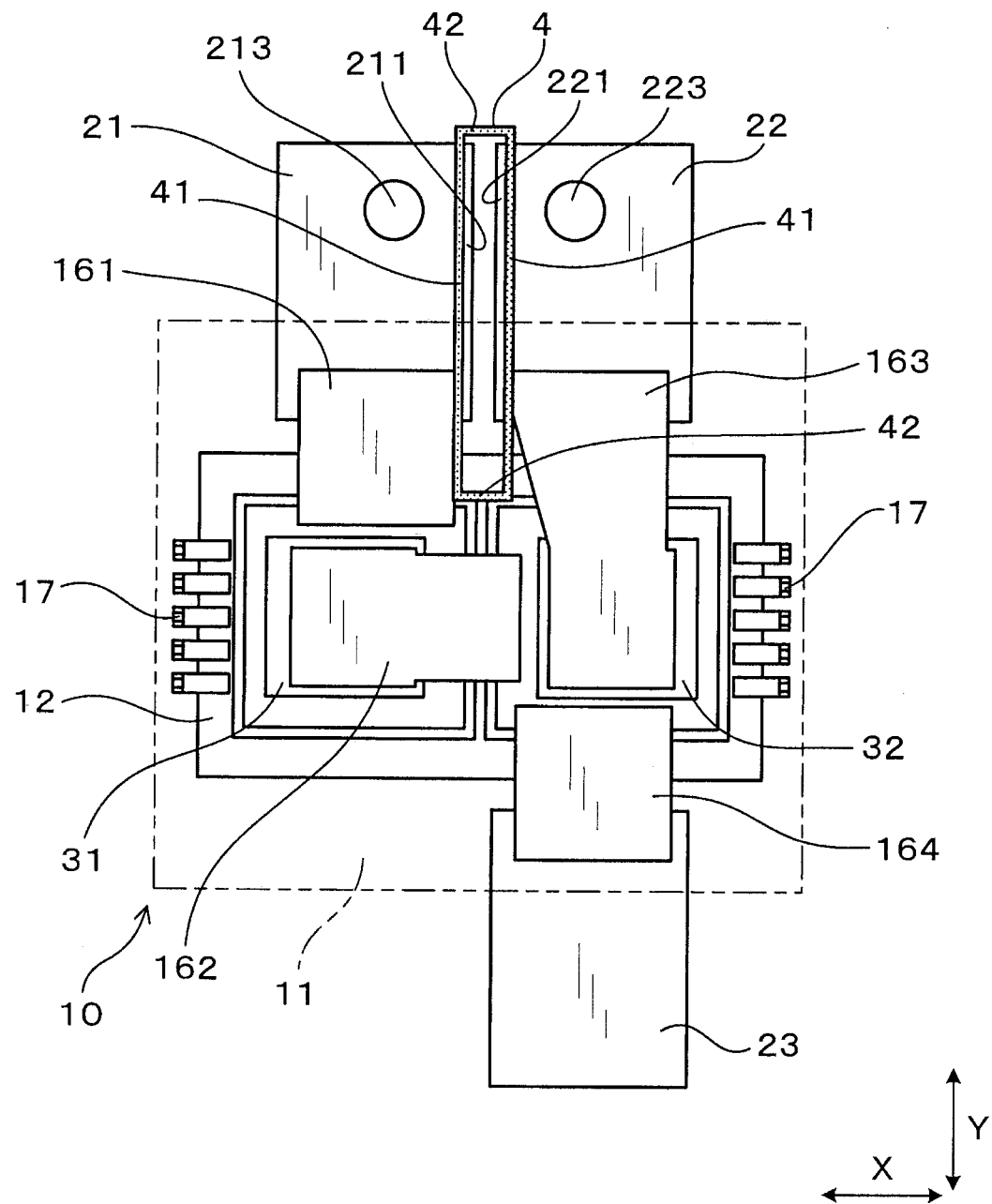
FIG. 1 shows a plan view of a semiconductor module in a first embodiment.
Figure 2:
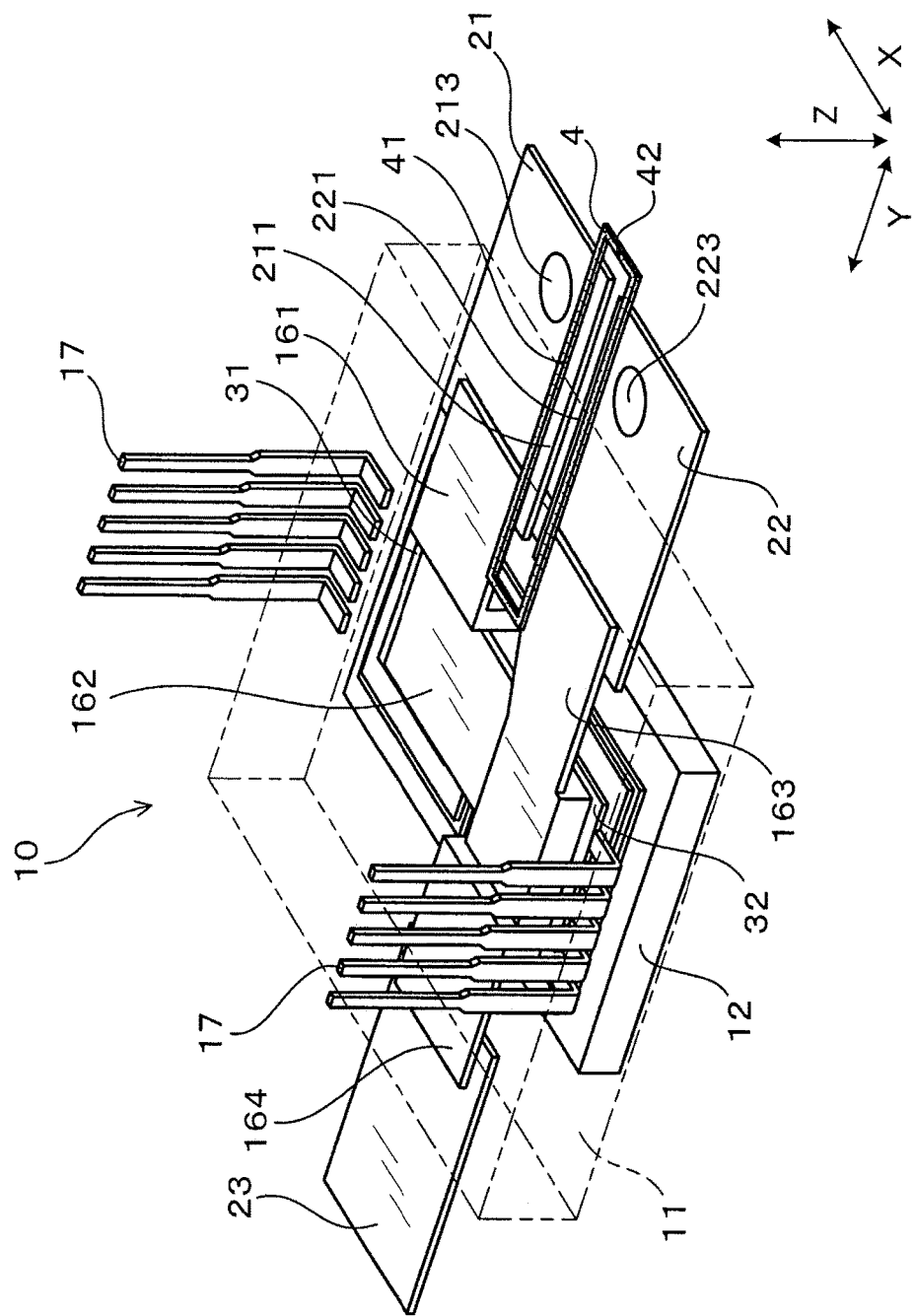
FIG. 2 shows a perspective view of the semiconductor module in the first embodiment.

As shown in FIG. 1 and FIG. 2, an electric power converter 1 of the present embodiment includes a positive electrode terminal 21 and a negative electrode terminal 22, a positive electrode side switching device 31, a negative electrode side switching device 32, an output terminal 23, and a counter conductor 4.

The positive electrode terminal 21 and negative electrode terminal 22 are disposed parallel and adjacent to each other.

The positive electrode side switching device 31 is a switching device connected to the positive electrode terminal 21.

The negative electrode side switching device 31 is a switching device connected to the negative electrode terminal 21.

The output terminal 23 is connected to a connection point between the positive electrode side switching device 31 and the negative electrode side switching device 32.

Figure 3:
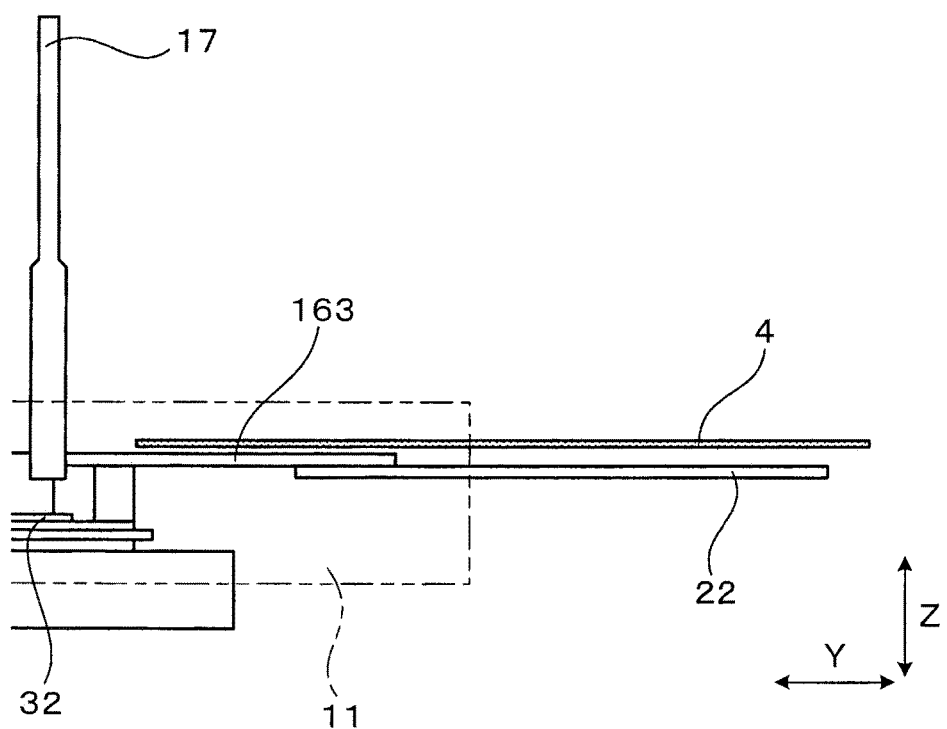
FIG. 3 shows a side view showing a positional relationship between a counter conductor and positive and the negative electrode terminals in the first embodiment.

As shown in FIGS. 1 to 3, the counter conductor 4 is disposed to face at least a portion of the positive electrode terminal 21 and at least a portion of the negative electrode terminal 22 in a height direction.

Here, the height direction being a direction perpendicular to both an aligned direction and a protruding direction of the positive electrode terminal 21 and the negative electrode terminal 22.

However, the height direction is a convenient expression, and is not limited particularly to a vertical direction. Hereinafter, the height direction is referred to as a Z direction as appropriate.

Further, the aligned direction of the positive electrode terminal 21 and the negative electrode terminal 22 is referred to as an X direction as appropriate.

Furthermore, the protruding direction of the positive electrode terminal 21 and the negative electrode terminal 22 is referred to as a Y direction as appropriate.

Then, the counter conductor 4 is disposed along a current path of an alternating current flowing through the positive electrode terminal 21, the positive electrode side switching device 31, the negative electrode side switching device 32, and the negative electrode terminal 22.

Hereinafter, this current path is referred to as an alternating current path as appropriate.

In the present embodiment, the counter conductor 4 is disposed on one side in the height direction, i.e., the Z direction of the positive electrode terminal 21 and the negative electrode terminal 22.

Note that the counter conductor 4 is electrically insulated relative to the positive electrode terminal 21 and the negative electrode terminal 22. The electric power converter 1 of the present embodiment is an inverter device that converts DC power to three-phase AC power.

Figure 5:
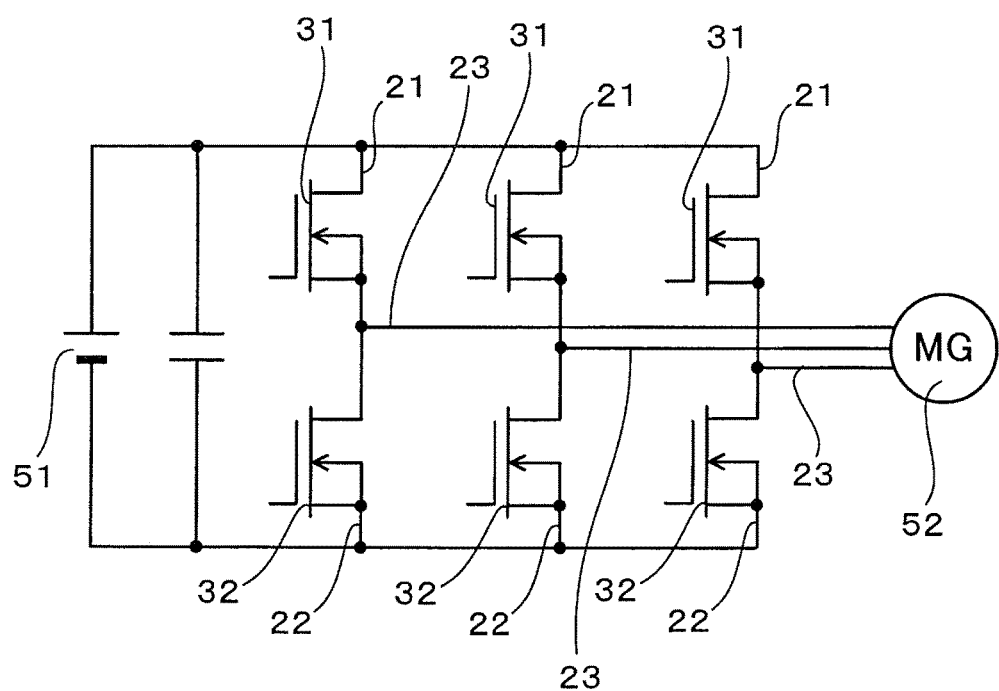
FIG. 5 is a diagram of an electric power converter circuit in the first embodiment.

Specifically, as shown in a circuit diagram of FIG. 5, it is configured to perform power conversion between a DC power source 51 and a three-phase AC load 52.

Then, the electric power converter 1 includes three each of positive electrode side switching devices 31 and negative electrode side switching devices 32.

Each of the positive electrode side switching devices 31 and the negative electrode side switching devices 32 are electrically connected in series to each other to constitute a single switching leg.

That is, the electric power converter 1 is provided with three switching legs.

Three switching legs are connected electrically in parallel to each other relative to a positive electrode and a negative electrode of the DC power source 51.

Further, each of the switching devices 31, 32 is made of an MOSFET.

The MOSFET stands for a Metal Oxide Field Effect Transistor.

It should be noted that the switching devices 31, 32 are not limited to the MOSFET, but an IGBT or the like can also be used.

The IGBT stands for an Insulated Gate Bipolar Transistor.

When using the IGBT, there is also an FWD being connected in antiparallel.

FWD stands for flywheel diode.

A drain of the positive electrode side switching device 31 is connected to the positive electrode terminal 21.

A source of the negative electrode side switching device 32 is connected to the negative electrode terminal 22.

The source of the positive electrode side switching device 31 and the drain of the negative electrode side switching device 32 are electrically connected to each other.

Then, the output terminal 23 is connected to a connection point between the source of the positive electrode side switching device 31 and the drain of the negative side switching device 32.

The positive electrode side switching device 31 and the negative electrode side switching device 32 constituting the single switching leg mentioned above are integrated in a single semiconductor module 10.

As shown in FIGS. 1 and 2, the positive electrode terminal 21, the negative electrode terminal 22, the positive electrode side switching device 31, the negative electrode side switching device 32, and the output terminal constitute the semiconductor module 10 that is integrated together with a mold resin 11.

At least a portion of the counter conductor 4 is held in the mold resin 11.

Figure 4:
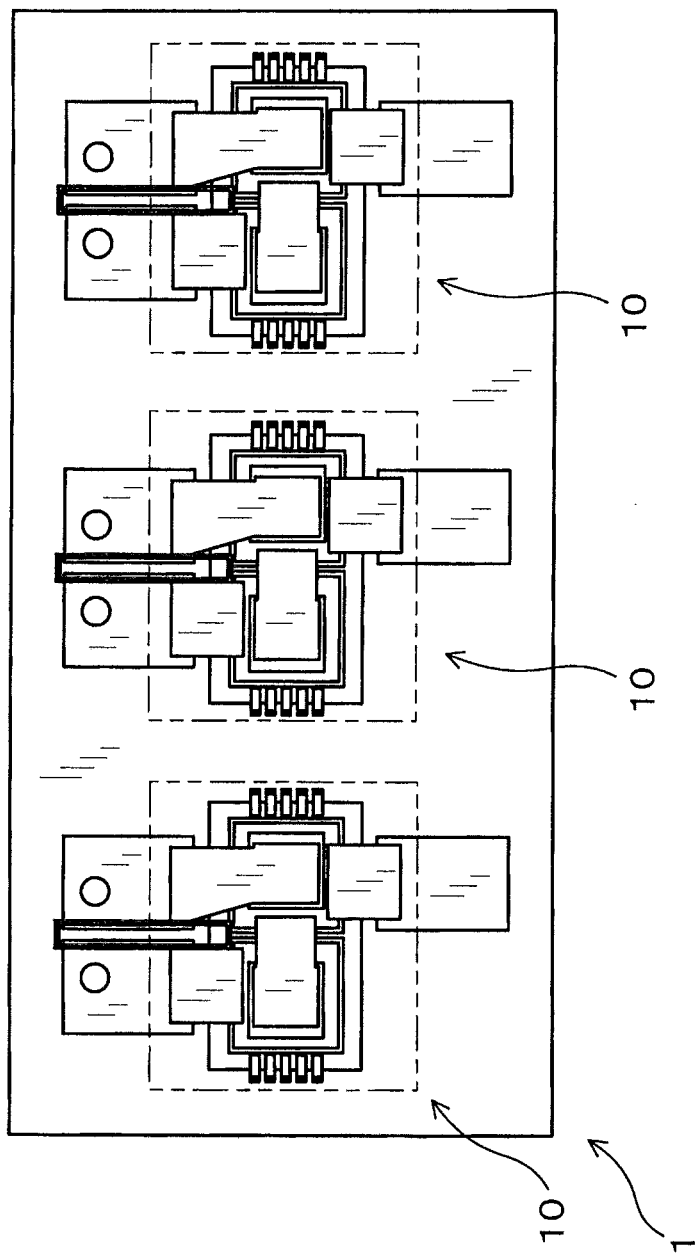
FIG. 4 shows a plan view of an electric power converter in the first embodiment.

Then, as shown in FIG. 4, the electric power converter 1 is provided with three semiconductor modules 10.

Incidentally, in FIGS. 1 to 4 or the like, an outline of the mold resin 11 is indicated by double-dashed chain lines.

Then, in each of the drawings, inner elements are shown in a state of being seen through the mold resin 11.

The same applies to the subsequent drawings equivalent to FIGS. 1 to 4.

As shown in FIGS. 1 and 2, in each semiconductor module 10, two switching devices 31, 32 are aligned in the X direction.

Then, the positive electrode terminal 21 and the negative electrode terminal 22 are protruded in the Y direction on the same side in the Y direction with respect to the two switching devices 31, 32.

Specifically, the positive electrode terminal 21 protrudes on one side in the Y direction relative to the positive electrode side switching device 31, and the negative electrode terminal 22 protrudes on one side in the Y direction relative to the negative electrode side switching device 32.

Further, the output terminal 23 is protruded on the opposite side to the negative electrode terminal 22 in the Y direction with respect to the negative electrode side switching device 32.

Figure 6:
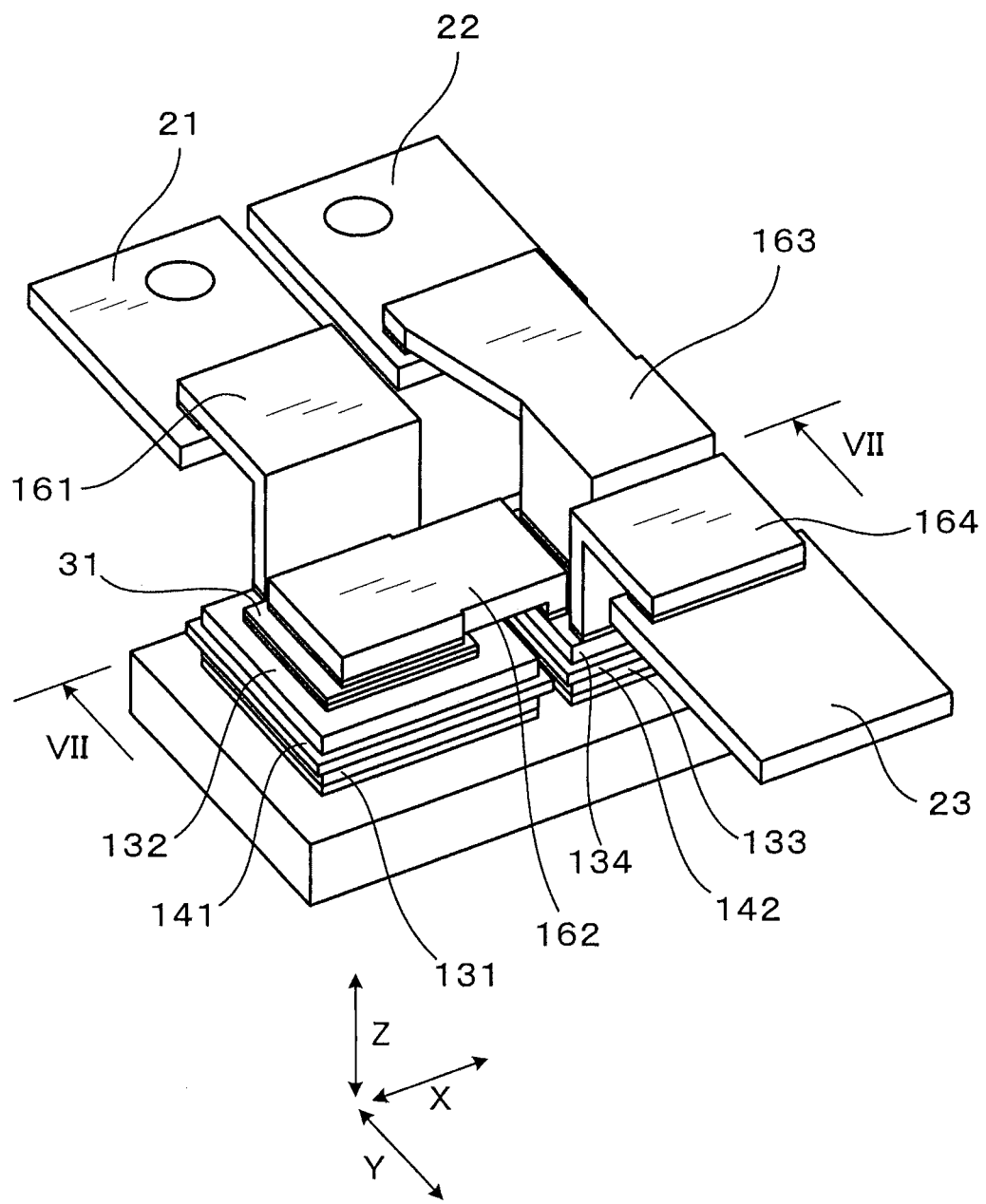
FIG. 6 is a perspective view of the semiconductor module, and is a view enlarging a dimension in a Z direction in the first embodiment.
Figure 7:
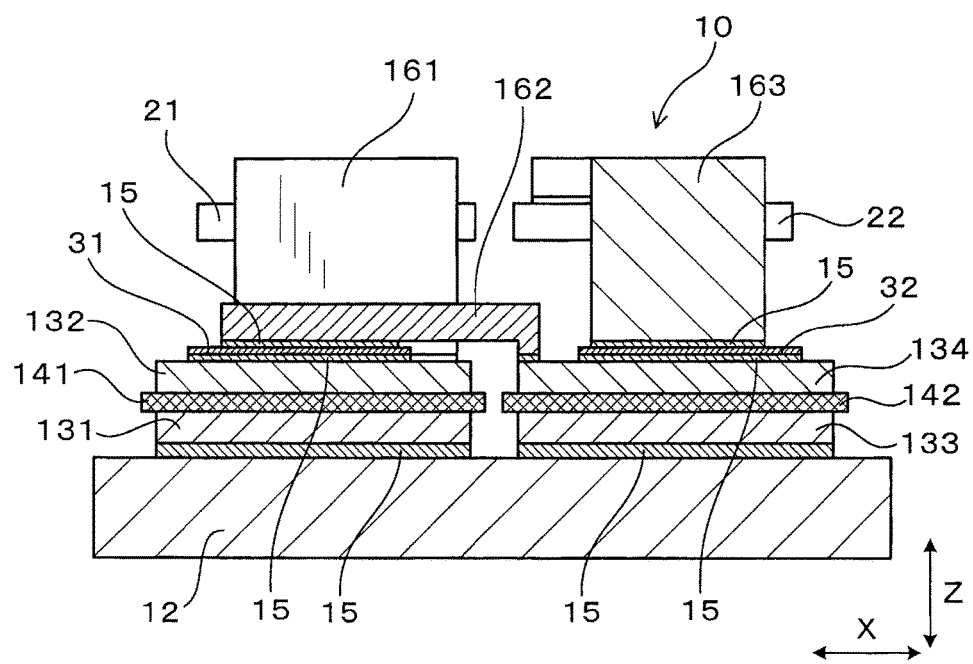
FIG. 7 shows a sectional view taken along a line VII-VII of FIG. 6.

As shown in FIGS. 6 and 7, the semiconductor module 10 is formed by stacking the positive electrode side switching device 31 and the negative switching device 32 together with other components on an upper surface of a base plate 12 of which a main surface is facing in the Z direction.

The up/low is a convenience expression.

A side of the base plate 12 where the switching devices 31, 32 are disposed is defined as an upper side, while an opposite side there to is defined as a lower side.

Further, FIG. 6 and FIG. 7 are explanatory drawings showing particularly increasing a thickness in the Z direction for easy understanding of a stacked structure of each layer in the semiconductor module 10.

Furthermore, some components are omitted in FIG. 6 and FIG. 7.

A copper pattern layer 131, an insulating layer 141, another copper pattern layer 132, and the positive electrode side switching device 31 are sequentially stacked on a part of the upper surface of the base plate 12.

In addition, another copper pattern layer 133, another insulating layer 142, another copper pattern layer 134, and the negative electrode side switching device 32 are sequentially stacked on another part of the upper surface of the base plate 12.

It should be noted that solder layers 15 are interposed between each of the components as appropriate.

Further, the respective positive electrode side switching device 31 and the negative electrode switching device 32 has the drain on a lower surface thereof, and the source on an upper surface thereof.

Incidentally, when the switching device is the IGBT, the element may have a collector on a lower surface and an emitter on an upper surface thereof.

The copper pattern layer 132 disposed on a lower side of the positive electrode side switching device 31 and the positive electrode terminal 21 are connected via a connecting conductor plate 161.

Further, the source on the upper surface of the positive electrode side switching device 31 and the copper pattern layer 134 disposed on a lower side of the negative electrode side switching device 32 are connected via another connecting conductor plate 162.

Further, the drain disposed on the upper surface of the negative electrode side switching device 32 and the negative electrode terminal 22 are connected via another connecting conductor plate 163.

Furthermore, as shown in FIG. 1 and FIG. 6, the copper pattern layer 134 disposed on the lower side of the negative switching device 32 and the output terminal 23 are connected via another connecting conductor plate 164.

Moreover, as shown in FIG. 1 and FIG. 2, a plurality of control terminals 17 are protruded toward an upper side in the Z direction at outsides in the X direction of the switching devices 31, 32.

Some of the control terminals 17 are connected to the gates of the switching devices 31, 32 in the semiconductor module 10.

Every component of the semiconductor module 10 described above is sealed in the mold resin 11.

However, the positive electrode terminal 21, the negative electrode terminal 22, the output terminal 23, the control terminals 17, and the base plate 12 are partially exposed from the mold resin 11.

In the present embodiment, the counter conductor 4 is also partially exposed from the mold resin 11.

Further, the respective positive electrode terminal 21 and the negative electrode terminal 22 has connecting portions 213, 223 to which conductors are connected to the respective terminal on a portion of a distal side exposed from the mold resin 11.

The positive electrode terminal 21 and the negative electrode terminal 22 with each made of a metal plate are disposed such that the thickness direction thereof is the height direction, i.e., the Z direction.

As shown in FIG. 1, the counter conductor 4 has portions along inner edges 211, 221 of the positive electrode terminal 21 and the negative electrode terminal 22 which are adjacent to each other.

In the present embodiment, the counter conductor 4 is formed in a loop shape.

Specifically, the counter conductor 4 has a rectangular loop shape when viewed from the Z direction.

Further, the rectangular counter conductor 4 has an elongated shape in the Y direction.

That is, the counter conductor 4 includes a pair of long side portions 41 extending in the Y direction and a pair of short side portions 42 extending in the X direction.

Then, each of the pair of long side portions 41 is disposed along the respective inner edge 211, 221 of the positive electrode terminal 21 and the negative electrode terminal 22.

Further, the short side portion 42 closer to the switching devices 31, 32 among the pair of short sides 42 is disposed to overlap with the base plate 12 when viewed from the Z direction.

The counter conductor 4 may be composed of a metal having excellent conductivity such as copper, for example.

The counter conductor 4 may be formed into the loop shape by press punching a metal plate, for example.

Alternatively, the counter conductor 4 may be a metal wire formed into the loop shape.

Next, the operations and effects of the present embodiment are described.

The electric power converter 1 includes the counter conductor 4.

The counter conductor 4 is disposed along the alternating current path.

Thereby, it is possible to suppress the parasitic inductance from being generated in the alternating current path.

That is, since the counter conductor 4 is disposed as described above, an induced current flows in the counter conductor 4 so as to cancel a magnetic flux caused by the alternating current flowing in the alternating current path.

Thereby, it is possible to suppress the parasitic inductance from being generated in the alternating current path.

Further, it is possible to reduce high-frequency magnetic flux caused by the alternating current flowing in the alternating current path.

Therefore, it becomes easy to prevent electromagnetic noise from influencing on electronic components in or around the electric power converter 1.

Then, since the counter conductor 4 is electrically isolated from the positive electrode terminal 21, the negative electrode terminal 22, and the output terminal 23, the counter conductor 4 may be disposed in a state where the distance between the positive electrode terminal 21 and the negative electrode terminal 22 is reduced.

Further, by using the counter conductor 4, it is not necessary to devise the positional relationship between the positive electrode terminal 21, the negative electrode terminal 22, and output terminal 23 for suppressing the parasitic inductance from being generated.

Therefore, it is possible to obtain a design flexibility of the electric power converter 1.

Further, the counter conductor 4 includes the pair of long side portions 41 as the portions along the inner edges 211, 221 that are adjacent to each other in the positive electrode terminal 21 and the negative electrode terminal 22.

Therefore, the parasitic inductance in the alternating current path can be more effectively suppressed from being generated.

That is, most of the current flowing through the positive electrode terminal 21 and the negative electrode terminal 22 are actually flowing near surfaces of each terminal due to a skin effect.

Furthermore, since a direction of the current flowing through the positive electrode terminal 21 and a direction of the current flowing through the negative electrode terminal 22 are opposite to each other, the current flow in a concentrated manner on the inner edges 211, 221 of the positive electrode terminal 21 and the negative electrode terminal 22 by a proximity effect.

Thus, by the counter conductor 4 having the portions along the inner edges 211, 221, the parasitic inductance can be suppressed from being generated effectively.

In addition, the counter conductor 4 is formed in the loop shape.

Therefore, while obtaining the parasitic inductance suppressing effect by the counter conductor 4, it is possible to reduce the weight and material cost.

That is, the induced current flowing in the counter conductor 4 accompanying the alternating current flowing in the alternating current path is formed in a loop shape.

Then, the magnetic flux caused by the alternating current is canceled by the loop-shaped induced current, and thereby the parasitic inductance is reduced.

Therefore, when the counter conductor 4 is formed in a shape along a path where the loop-shaped induced current flows, it is possible to obtain the suppressing effect of the parasitic inductance.

On the other hand, it is possible to reduce weight and material cost rather than when the counter conductor 4 is formed into a plate shape or the like.

Further, the counter conductor 4 is held in the mold resin 11.

Accordingly, the counter conductor 4 can be held stably without causing any positional deviation relative to the alternating current path.

Therefore, it becomes easy to dispose the counter conductor 4 close to the alternating current path, and it becomes easy to improve the effect of suppressing the parasitic inductance from being generated.

As described above, according to the present embodiment, it is possible to provide an electric power converter capable of effectively suppressing the parasitic inductance from being generated.

[Second Embodiment]

Figure 8:
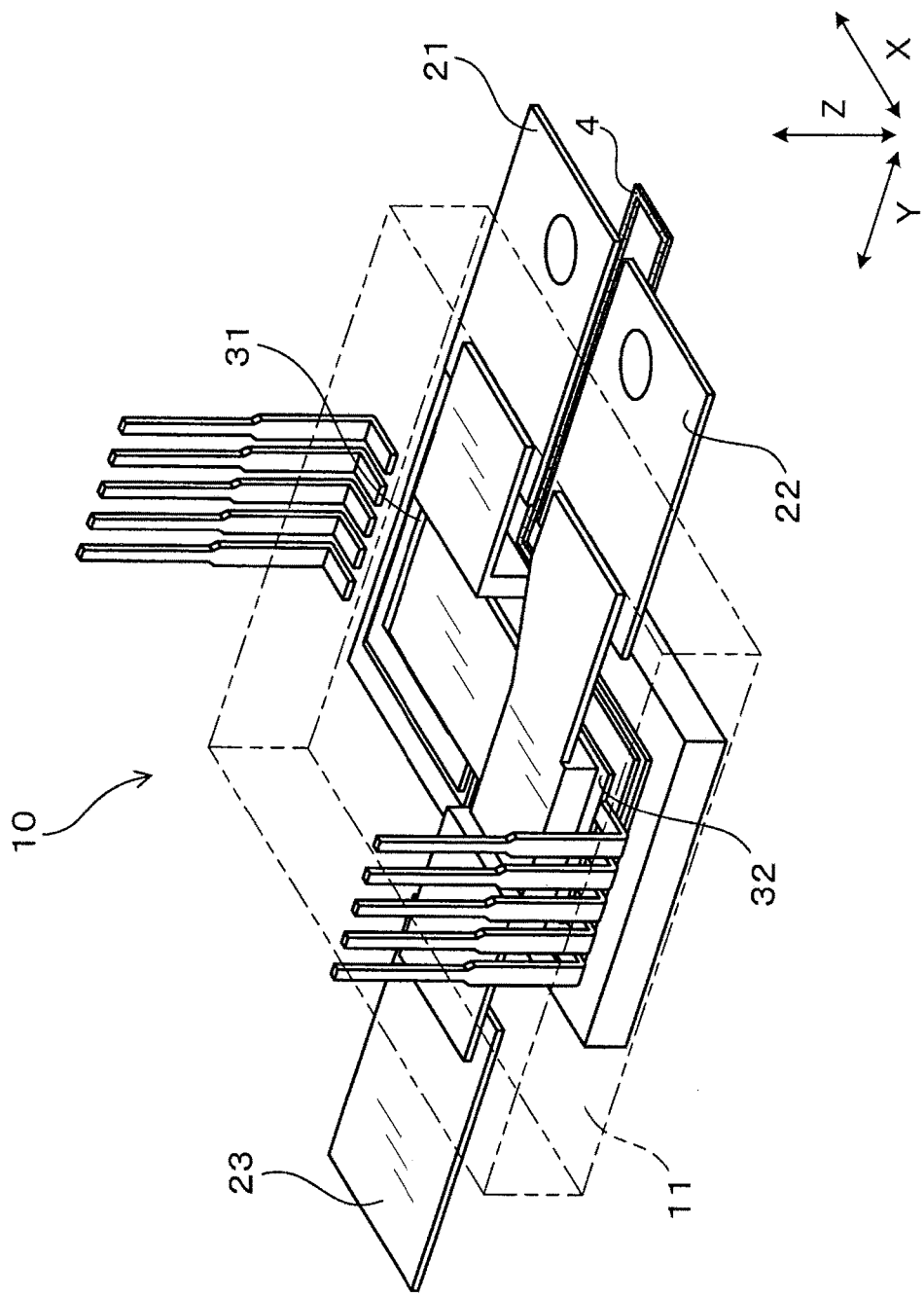
FIG. 8 shows a perspective view of a semiconductor module in a second embodiment.
Figure 9:
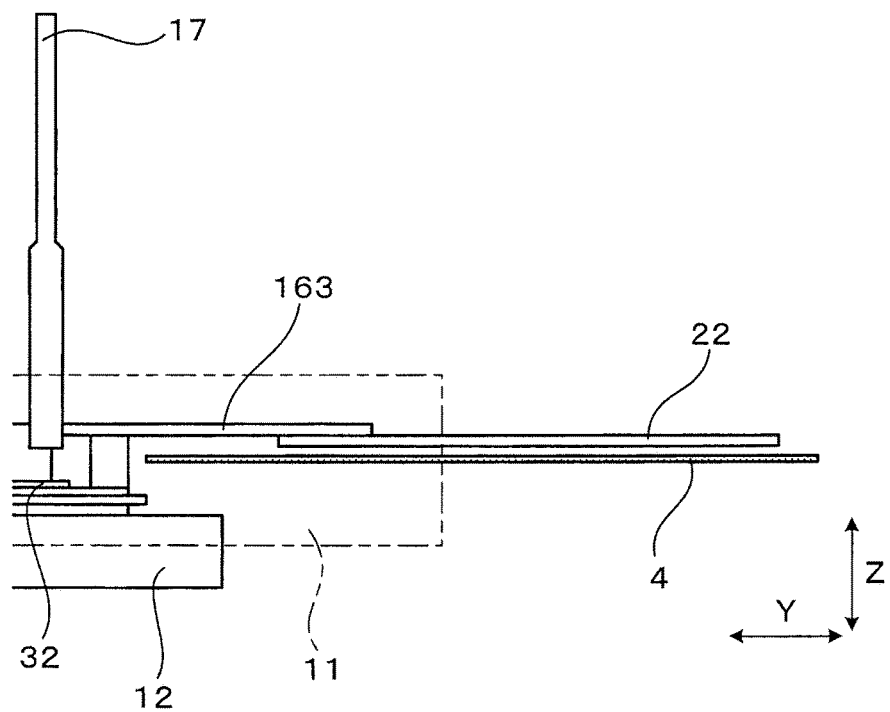
FIG. 9 shows a side view showing a positional relationship between a counter conductor and positive and the negative electrode terminals in the second embodiment.

As shown in FIG. 8 and FIG. 9, the present embodiment is an embodiment that a counter conductor 4 which is disposed on lower sides of a positive electrode terminal 21 and a negative electrode terminal 22.

That is, a case where the counter conductor 4 is disposed on upper side of the positive electrode terminal 21 and the negative electrode terminal 22 is disclosed in the first embodiment.

However, contrary to this, the counter conductor 4 is disposed on the lower side of the positive electrode terminal 21 and the negative electrode terminal 22 in the present embodiment.

That is, the counter conductor 4 is disposed facing the positive electrode terminal 21 and the negative electrode terminal 22 from below.

Other configurations are the same as those in the first embodiment.

It should be appreciated that, in the second embodiment and the subsequent embodiments, components identical with or similar to those in the first embodiment are given the same reference numerals, unless otherwise indicated, and repeated structures and features thereof will not be described in order to avoid redundant explanation.

Even in the present embodiment, it is possible to obtain the same functions and effects as the first embodiment.

[Third Embodiment]

Figure 10:
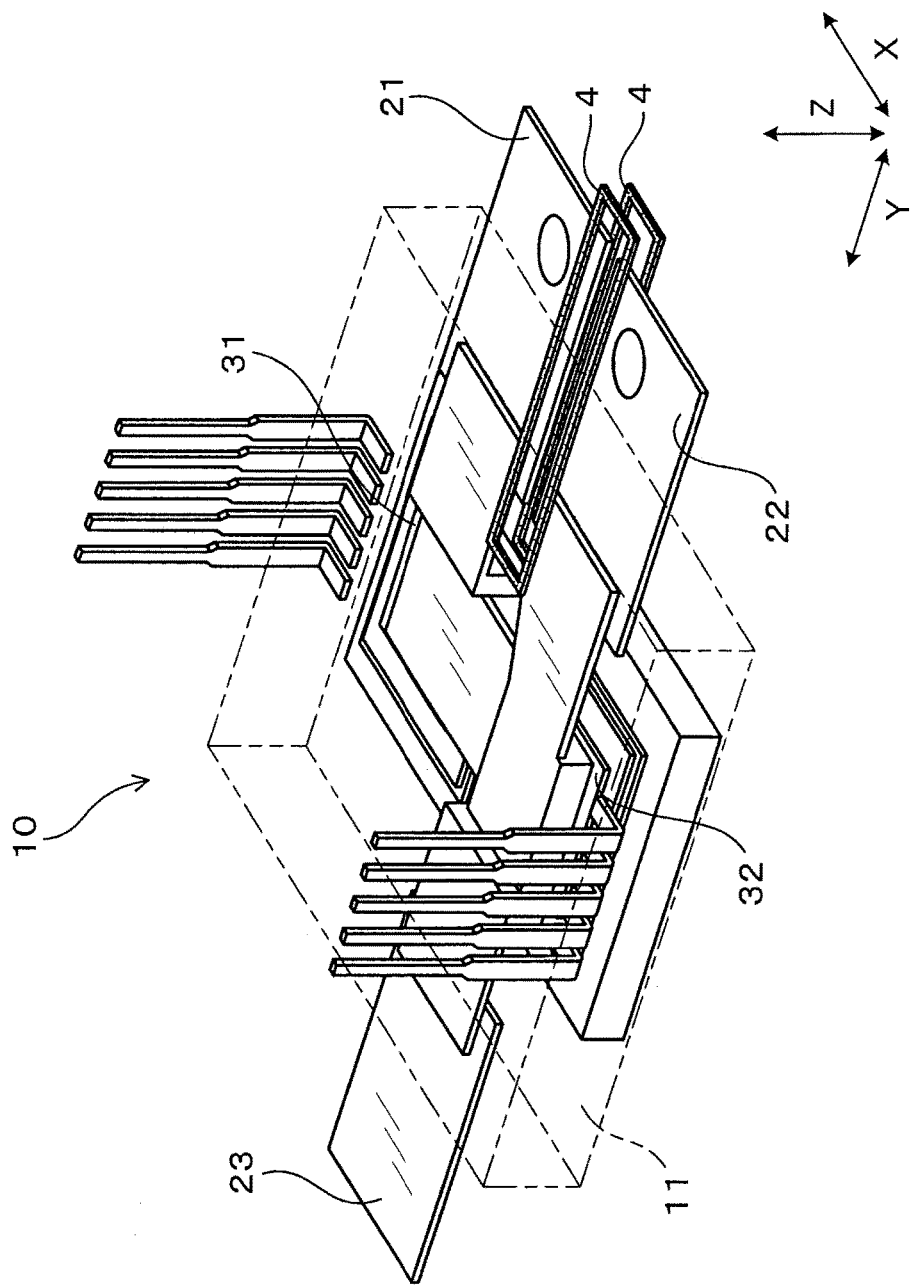
FIG. 10 shows a perspective view of a semiconductor module in a third embodiment.
Figure 11:
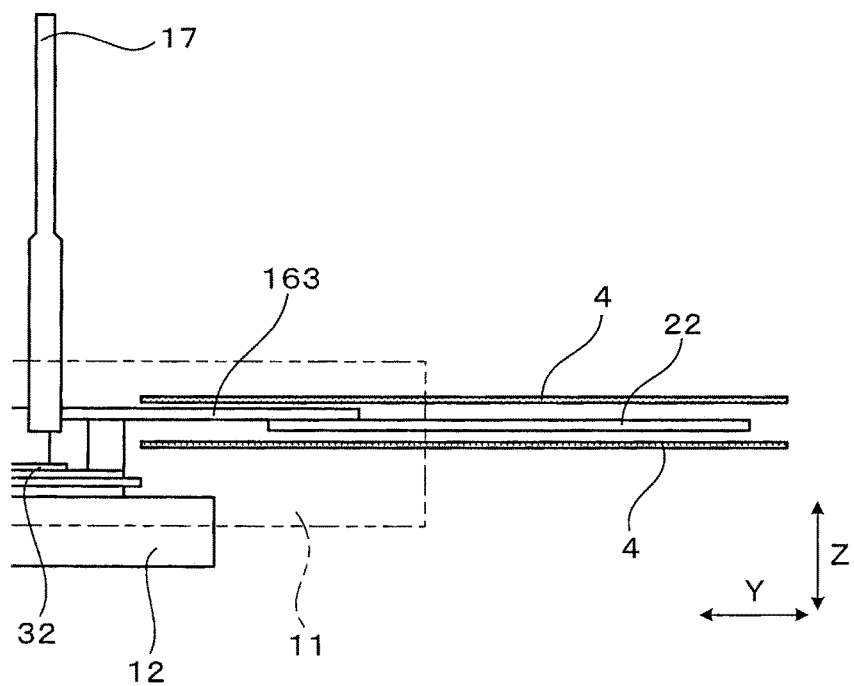
FIG. 11 shows a side view showing a positional relationship between a counter conductor and positive and the negative electrode terminals in the third embodiment.

As shown in FIG. 10 and FIG. 11, counter conductors 4 are disposed on both sides in the height direction of a positive electrode terminal 21 and a negative electrode terminal 22 in the present embodiment.

That is, the counter conductors 4 are disposed facing the positive electrode terminal 21 and the negative electrode terminal 22 from both sides in the Z direction in the present embodiment.

The counter conductor 4 disposed on the upper side of the positive electrode terminal 21 and the negative electrode terminal 22, and the counter conductor 4 disposed on the lower side thereof are electrically independent from each other.

Further, a pair of the counter conductors 4 are formed in the same position and the same shape so as to overlap each other when viewed from the Z direction.

However, it is not necessarily limited thereto.

Other configurations are the same as those in the first embodiment.

In the present embodiment, the induced currents that cancel the magnetic flux caused by alternating current generated in the alternating current path including the positive electrode terminal 21 and the negative electrode terminal 22 are formed in both the pair of counter conductors 4.

Therefore, it is possible to more effectively reduce the parasitic inductance.

Apart from that, it has the same functions and effects as the first embodiment.

[Fourth Embodiment]

Figure 12:
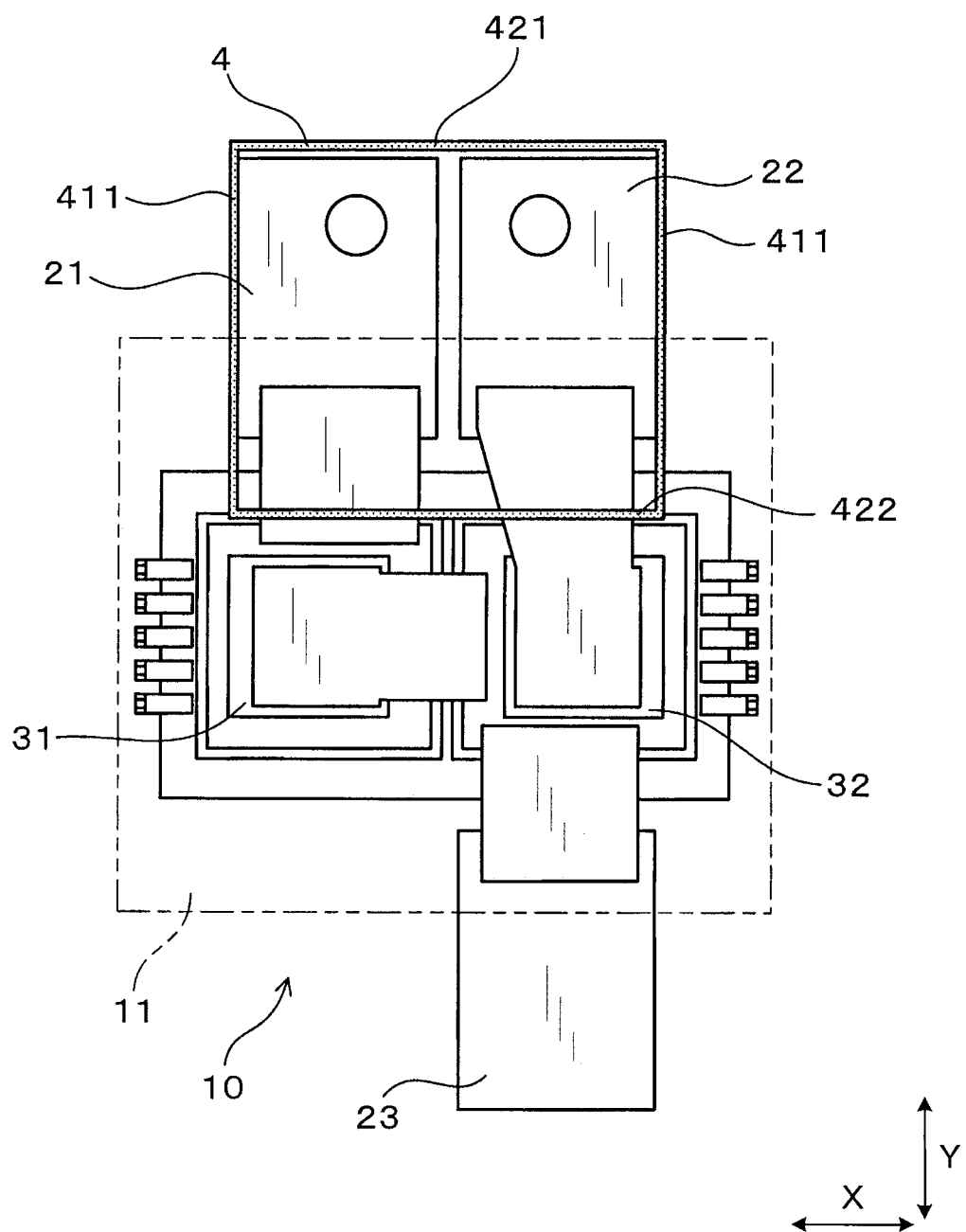
FIG. 12 is a plan view of a semiconductor module in a fourth embodiment.

As shown in FIG. 12, the present embodiment is an embodiment that a shape of a counter conductor 4 is enlarged in the X direction relative to the one shown in the first embodiment.

In the present embodiment, the counter conductor 4 includes a pair of side portions 411 extending in the Y direction, and a front side portion 421 and a rear side portion 422 extending in the X direction.

The counter conductor 4 has a substantially square loop shape as viewed from the Z direction.

The pair of side portions 411 are respectively disposed along outer edges 212, 222 of a positive electrode terminal 21 and a negative electrode terminal 22.

Then, as viewed from the Z direction, the counter conductor 4 is disposed so as to surround the positive electrode terminal 21 and the negative electrode terminal 22.

Other configurations are the same as those in the first embodiment.

Even in the present embodiment, it is possible to obtain the same functions and effects as the first embodiment.

[Fifth Embodiment]

Figure 13:
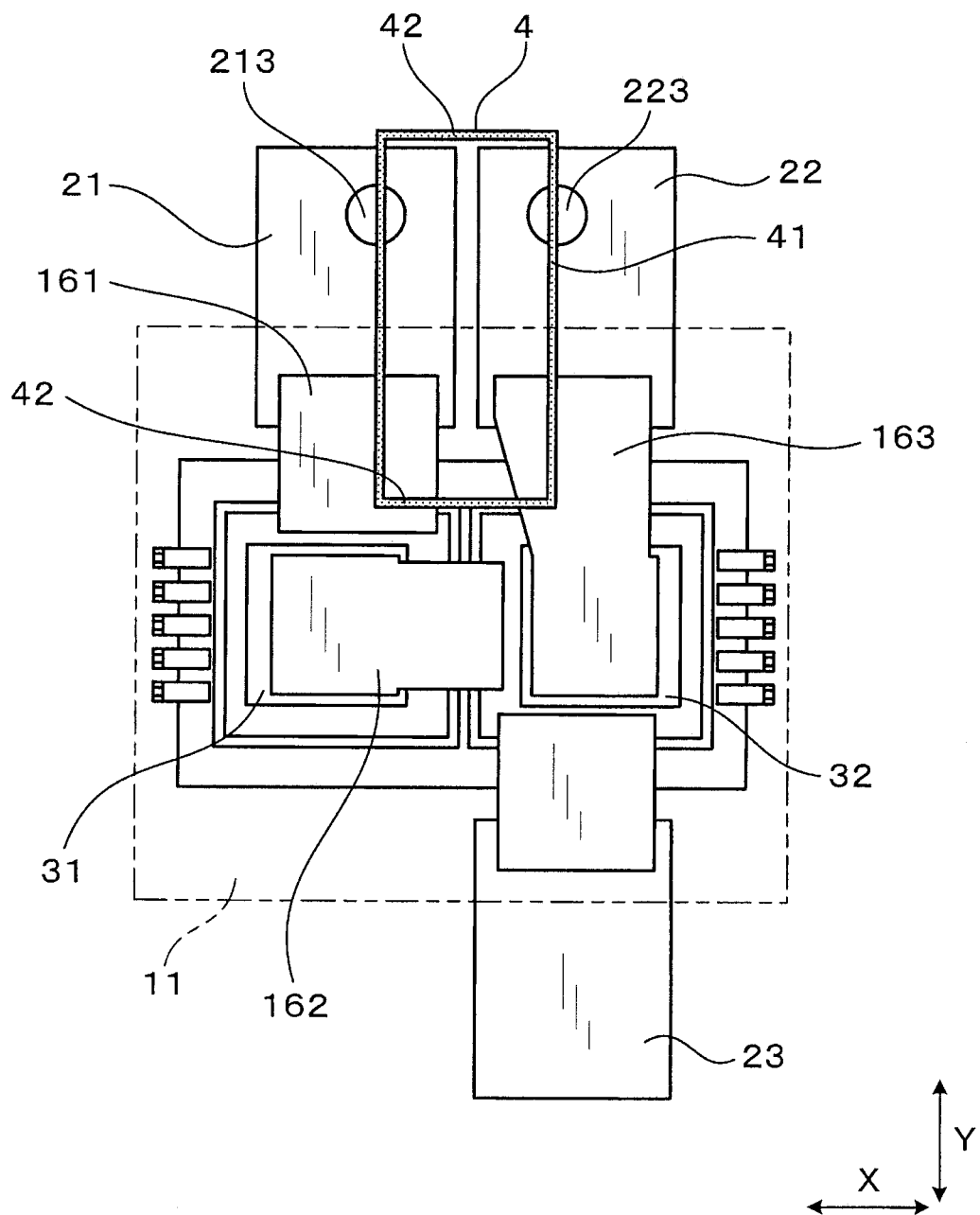
FIG. 13 is a plan view of a semiconductor module in a fifth embodiment.

As shown in FIG. 13, the present embodiment is an embodiment that a size of a counter conductor 4 in the X direction is larger than the one shown in the first embodiment and smaller than the one shown in the fourth embodiment.

In the present embodiment, a pair of long side portions 41 of the counter conductor 4 are disposed at positions passing through connecting portions 213, 223 formed respectively to the positive electrode terminal 21 and the negative electrode terminal 22 as viewed from the Z direction.

Other configurations are the same as those in the first embodiment.

Even in the present embodiment, it is possible to obtain the same functions and effects as the first embodiment.

[Sixth Embodiment]

Figure 14:
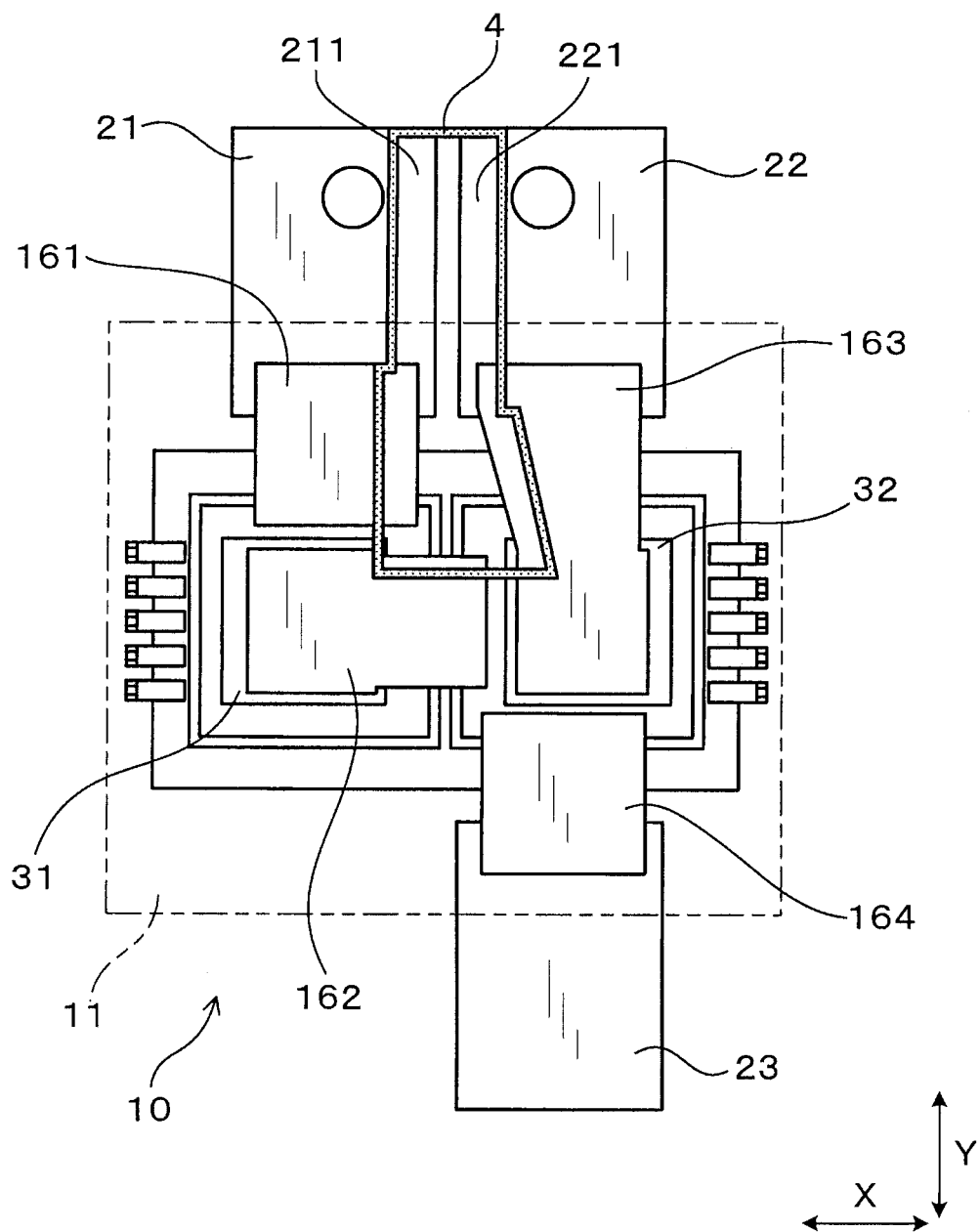
FIG. 14 is a plan view of a semiconductor module in a sixth embodiment.

As shown in FIG. 14, the present embodiment is an embodiment that a counter conductor 4 is formed into a shape along a disposition shape of a plurality of connecting conductor plates 161, 162, 163 of the semiconductor module 10 as viewed from the Z direction.

The plurality of connecting conductor plates 161, 162, 163 are also included in an alternating current path.

The alternating current path is formed in a substantially U-shape that is a disposition shape of a positive electrode terminal 21, a positive electrode side switching device 31, a negative electrode side switching device 32, and a negative electrode terminal 22.

Among these, a portion where a current flows in a concentrated manner especially is an inner circumferential side portion of the substantially U-shape.

The inner circumferential side portion is formed by inner edges 211, 221 of the positive electrode terminal 21 and the negative electrode terminal 22 together with edges of the connection conductor plates 161, 162, 163.

More specifically, the aforementioned inner circumferential side portion includes an edge of the connection conductor plate 161 in the connecting conductor plate 163 side in the X direction, a portion of an edge of the connecting conductor plate 162 in a side in the Y direction where the positive electrode terminal 21 and the negative electrode terminal 22 are protruding, and a portion of an edge of the connection conductor plate 163 in the connecting conductor plate 161 side in the X direction.

Thereby, the counter conductor 4 is formed so as to be disposed along these portions.

Other configurations are the same as in the first embodiment.

In the present embodiment, it is possible to dispose the counter conductor 4 more accurately along a path where the current flows in a concentrated manner especially within the alternating current path.

Therefore, the parasitic inductance can be further effectively suppressed from being generated.

Apart from that, it has the same functions and effects as the first embodiment.

[Seventh Embodiment]

Figure 15:
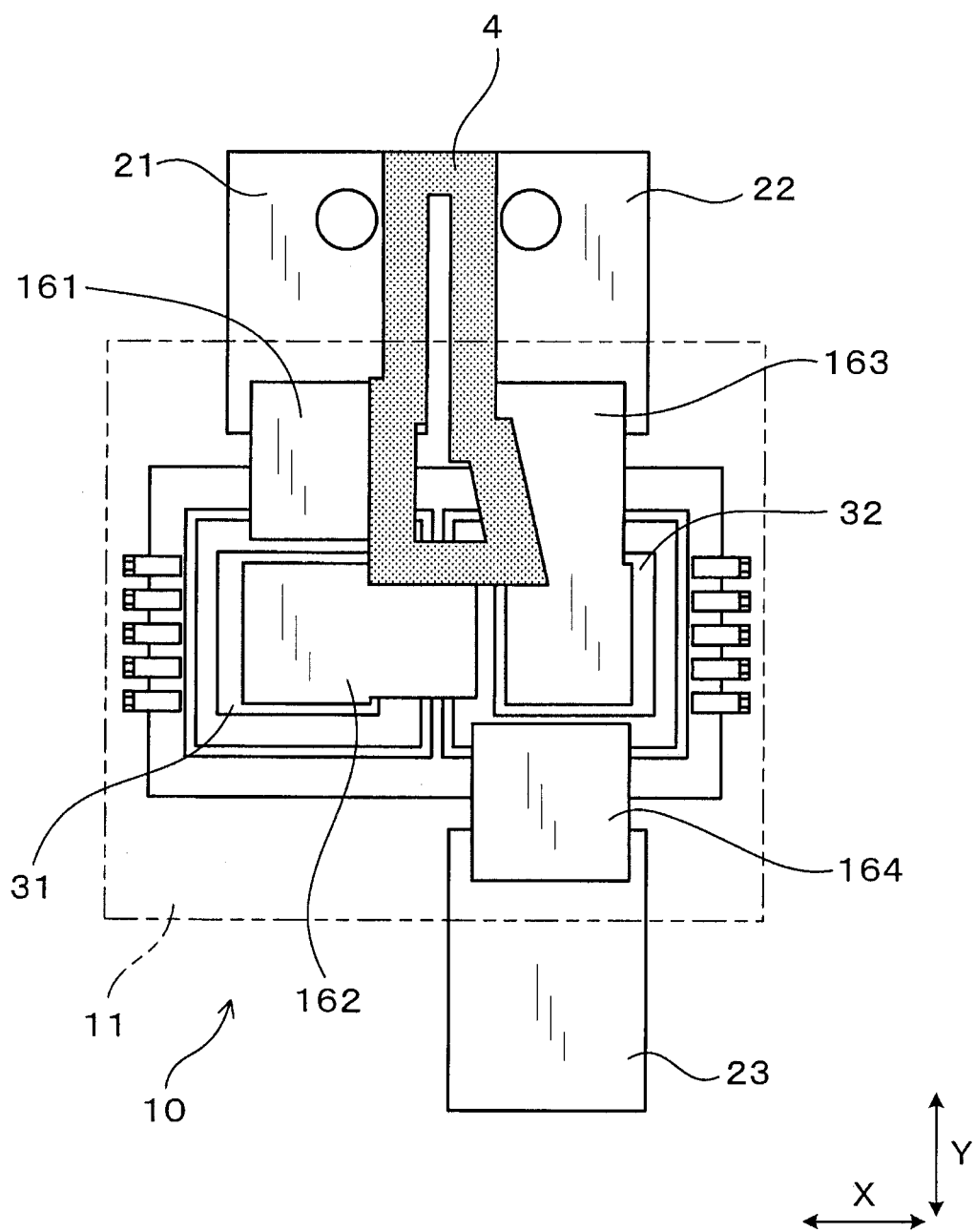
FIG. 15 is a plan view of a semiconductor module in a seventh embodiment.

As shown in FIG. 15, the present embodiment is an embodiment that a width of a loop-shaped counter conductor 4 is increased.

That is, the width of the conductor in a cross section orthogonal to an alternating current path in the loop-shaped counter conductor 4 is larger than the counter conductor 4 shown in the sixth embodiment.

Here, the width of the conductor is a width in a direction orthogonal to the Z direction.

Other configurations are the same as those in the sixth embodiment.

In the present embodiment, it is possible to reduce an electrical resistance with respect to an induced current flowing through the counter conductor 4.

Therefore, the induced current flows easily, and the parasitic inductance of the alternating current path including a positive electrode terminal 21 and a negative electrode terminal 22 can be suppressed more effectively from being generated.

It should be noted that it is also possible to increase a thickness of the counter conductor 4 in the Z direction to reduce the electrical resistance with respect to the induced current.

Apart from that, it has the same functions and effects as the sixth embodiment.

[Eighth Embodiment]

Figure 16:
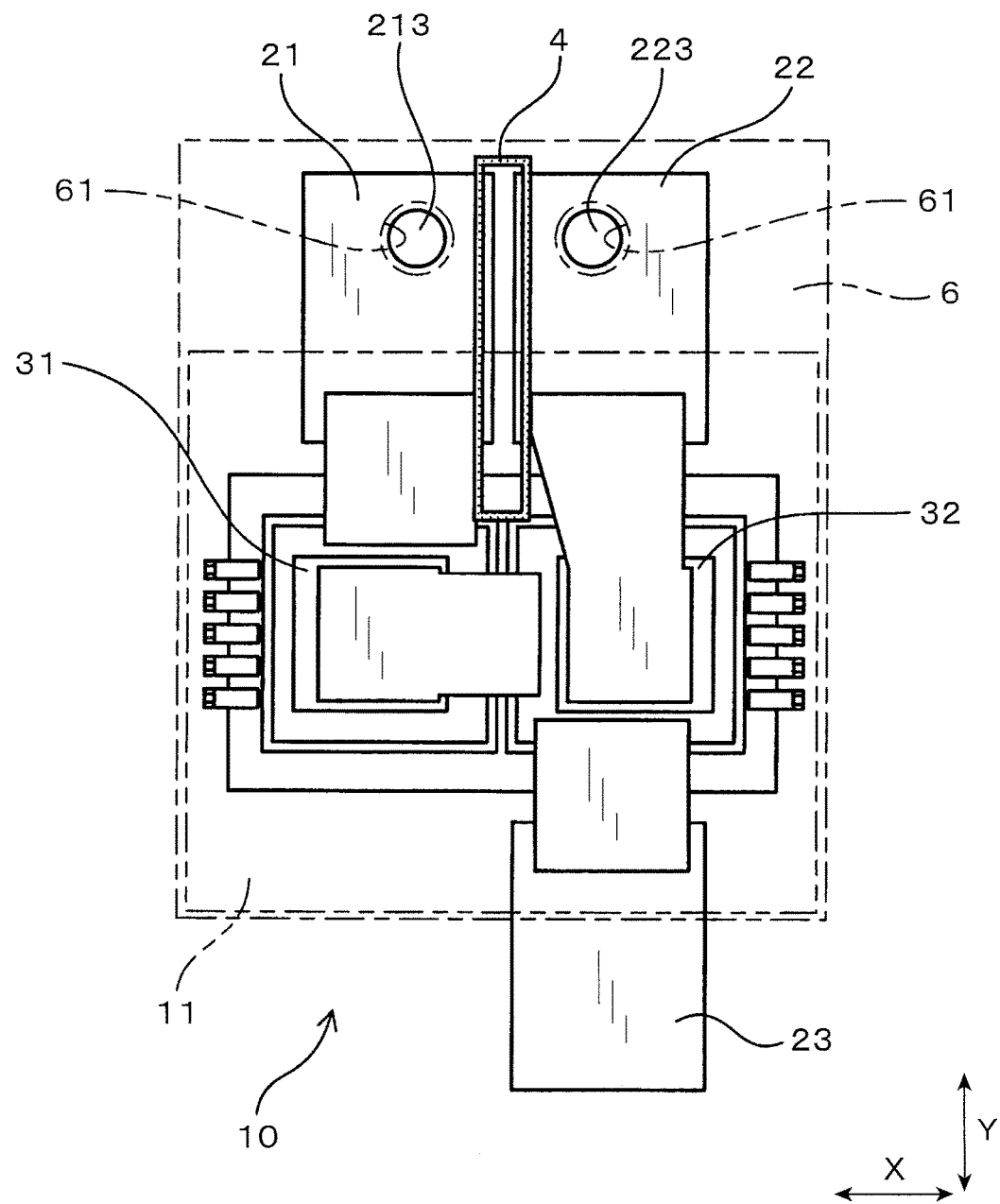
FIG. 16 shows a plan view of an electric power converter in an eighth embodiment.
Figure 17:
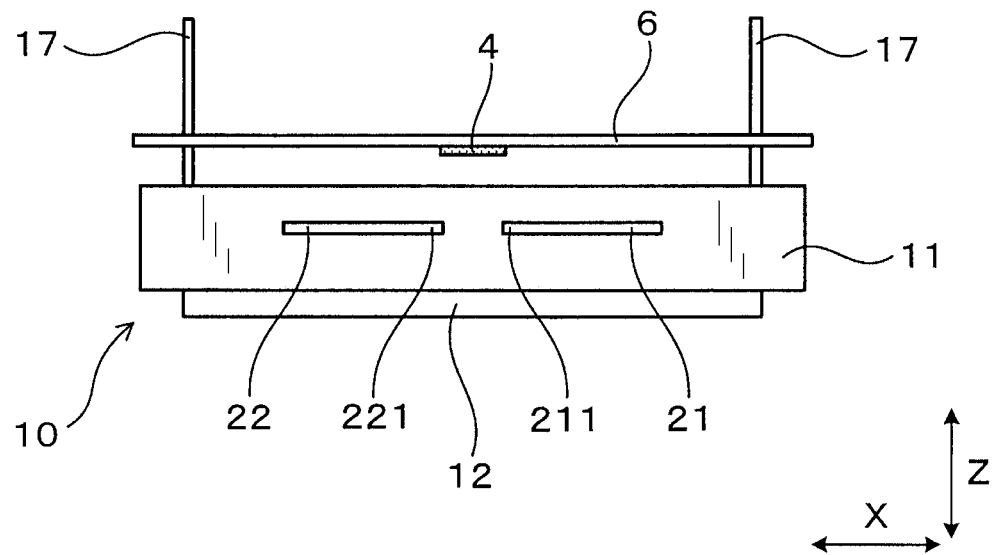
FIG. 17 is a plan view of the electric power converter as seen from a protruding direction of positive and the negative electrode terminals in the eighth embodiment.
Figure 18:
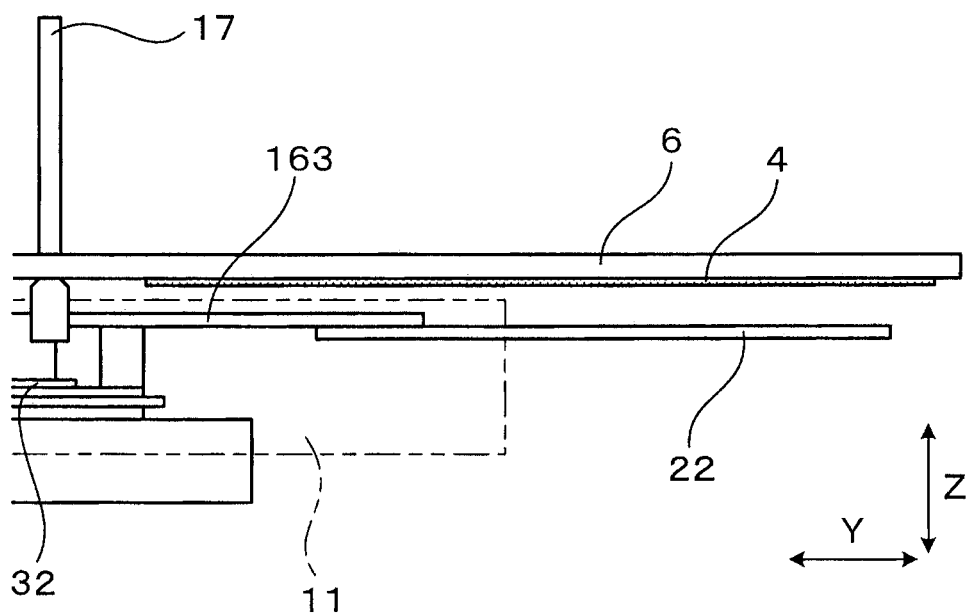
FIG. 18 shows a side view showing a positional relationship between a counter conductor and positive and the negative electrode terminals in the eighth embodiment.

As shown in FIGS. 16 to 18, the present embodiment is an embodiment that a counter conductor 4 is formed on a circuit board 6.

That is, an electric power converter 1 has the circuit board 6 having a control circuit for controlling a positive electrode side switching device 31 and a negative electrode side switching device 32.

Then, the counter conductor 4 is formed on the circuit board 6. The counter conductor 4 is formed on the circuit board 6 as a conductor pattern.

The conductor pattern constituting the counter conductor 4 is formed on the circuit board 6 by, for example, plating or the like together with other wiring patterns.

As shown in FIGS. 17 and 18, the counter conductor 4 is formed on a lower surface of the circuit board 6 in the present embodiment.

The circuit board 6 is disposed on an upper side of a semiconductor module 10.

The circuit board 6 and the semiconductor module 10 are disposed substantially parallel to each other so as to face each other in the Z direction.

A plurality of through holes are formed in the circuit board 6, and control terminals 17 are inserted through the through holes.

Thereby, the circuit board 6 and the semiconductor module 10 are electrically connected.

In addition, the circuit board 6 is disposed also to face a positive electrode terminal 21 and a negative electrode terminal 22 in the Z direction.

Then, the counter conductor 4 is formed on the circuit board 6 in a region facing the positive electrode terminal 21 and the negative electrode terminal 22.

Note that, as shown in FIG. 16, openings 61 opening toward connecting portions 213, 223 formed on the positive electrode terminal 21 and the negative electrode terminal 22 are formed in the circuit board 6.

Other configurations are the same as those in the first embodiment.

In the present embodiment, the counter conductor 4 is formed on the circuit board 6.

Therefore, the counter conductor 4 can be formed together with other wiring patterns.

Therefore, it is not particularly necessary to newly provide a process for forming the counter conductor 4, and thus it is possible to obtain an electric power converter 1 having excellent productivity.

Apart from that, it has the same functions and effects as the first embodiment.

[Ninth Embodiment]

Figure 19:
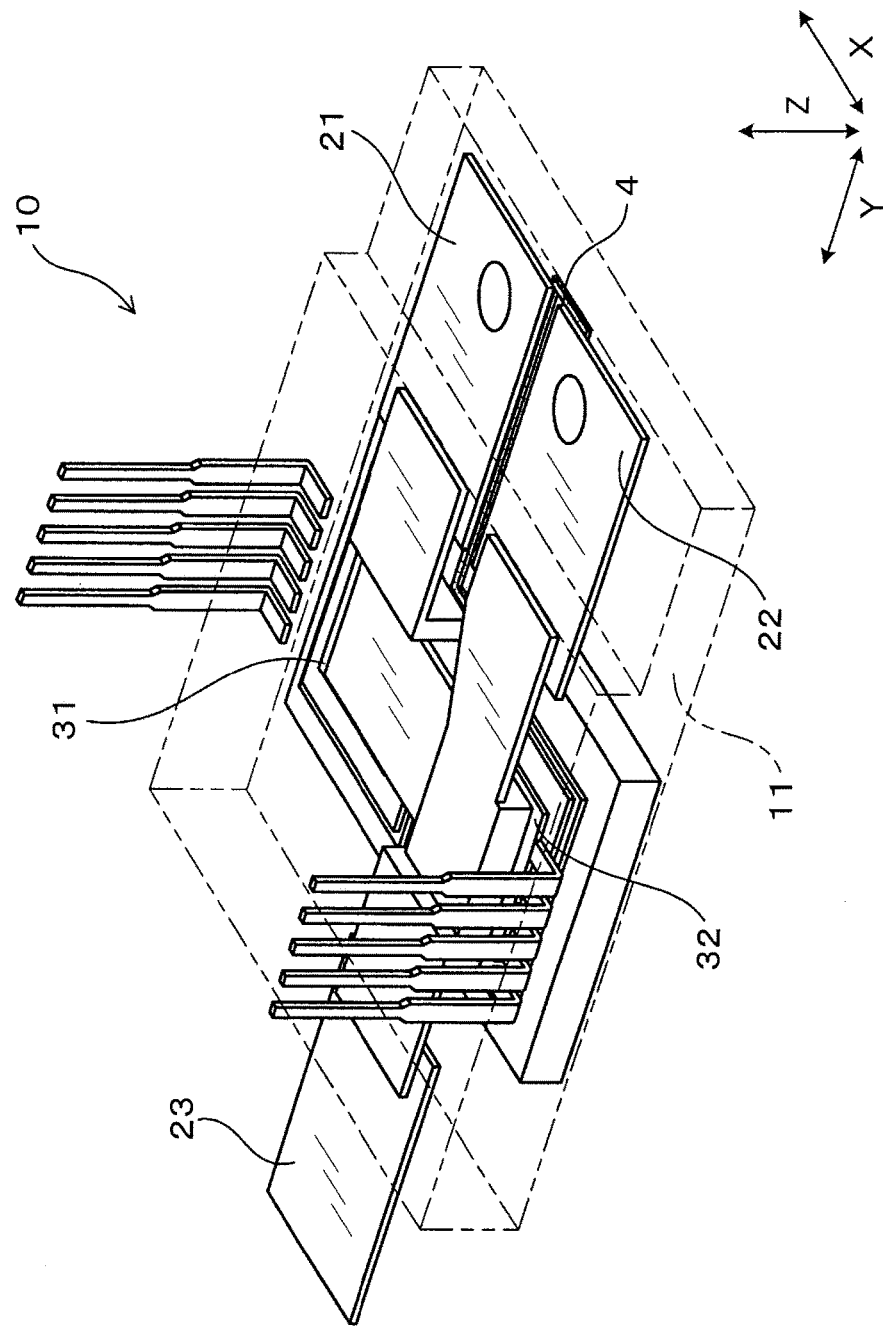
FIG. 19 shows a perspective view of a semiconductor module in a ninth embodiment.
Figure 20:
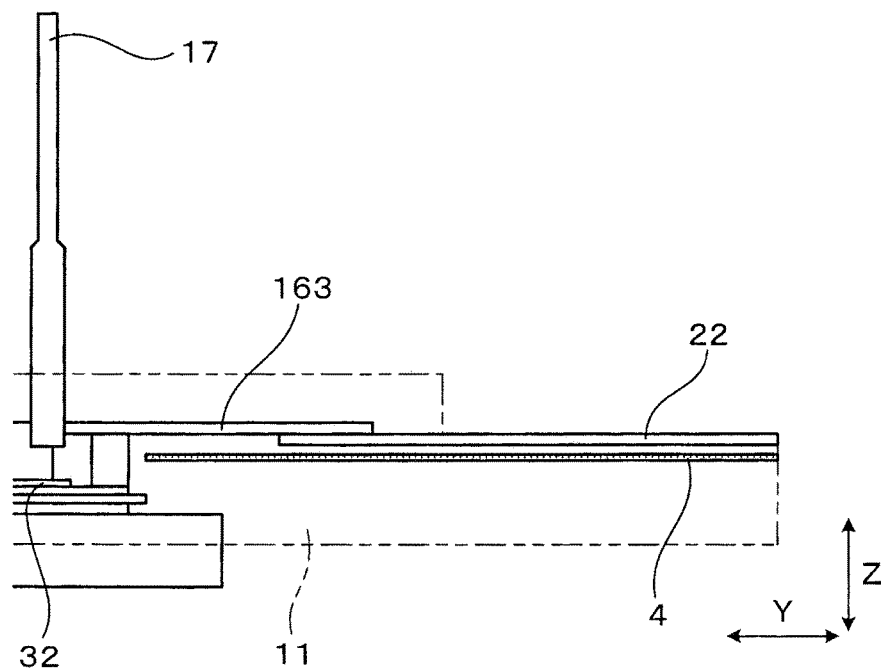
FIG. 20 shows a side view showing a positional relationship between a counter conductor and positive and the negative electrode terminals in the ninth embodiment.

As shown in FIGS. 19 and 20, the present embodiment is an embodiment that an entire counter conductor 4 is sealed in a mold resin 11.

That is, in the present embodiment, the mold resin 11 of a semiconductor module 10 is extended to distal ends of a positive electrode terminal 21 and a negative electrode terminal 22 on lower sides of the positive electrode terminal 21 and the negative electrode terminal 22.

Then, the counter conductor 4 is disposed on the lower sides of the positive electrode terminal 21 and the negative electrode terminal 22, and the counter conductor 4 is sealed with the mold resin 11.

Other configurations are the same as those in the second embodiment.

In the present embodiment, since the entire counter conductor 4 is sealed with the mold resin 11, the counter conductor 4 can be held more stably.

As a result, it becomes easier to dispose the counter conductor 4 close to the alternating current path, thus it is possible to reduce the parasitic inductance more effectively.

Apart from that, it has the same functions and effects as the second embodiment.

[Comparative Embodiment]

An electric power converter provided without a counter conductor 4 as a comparative example will be described with reference to FIGS. 21 and 22.

Figure 21:
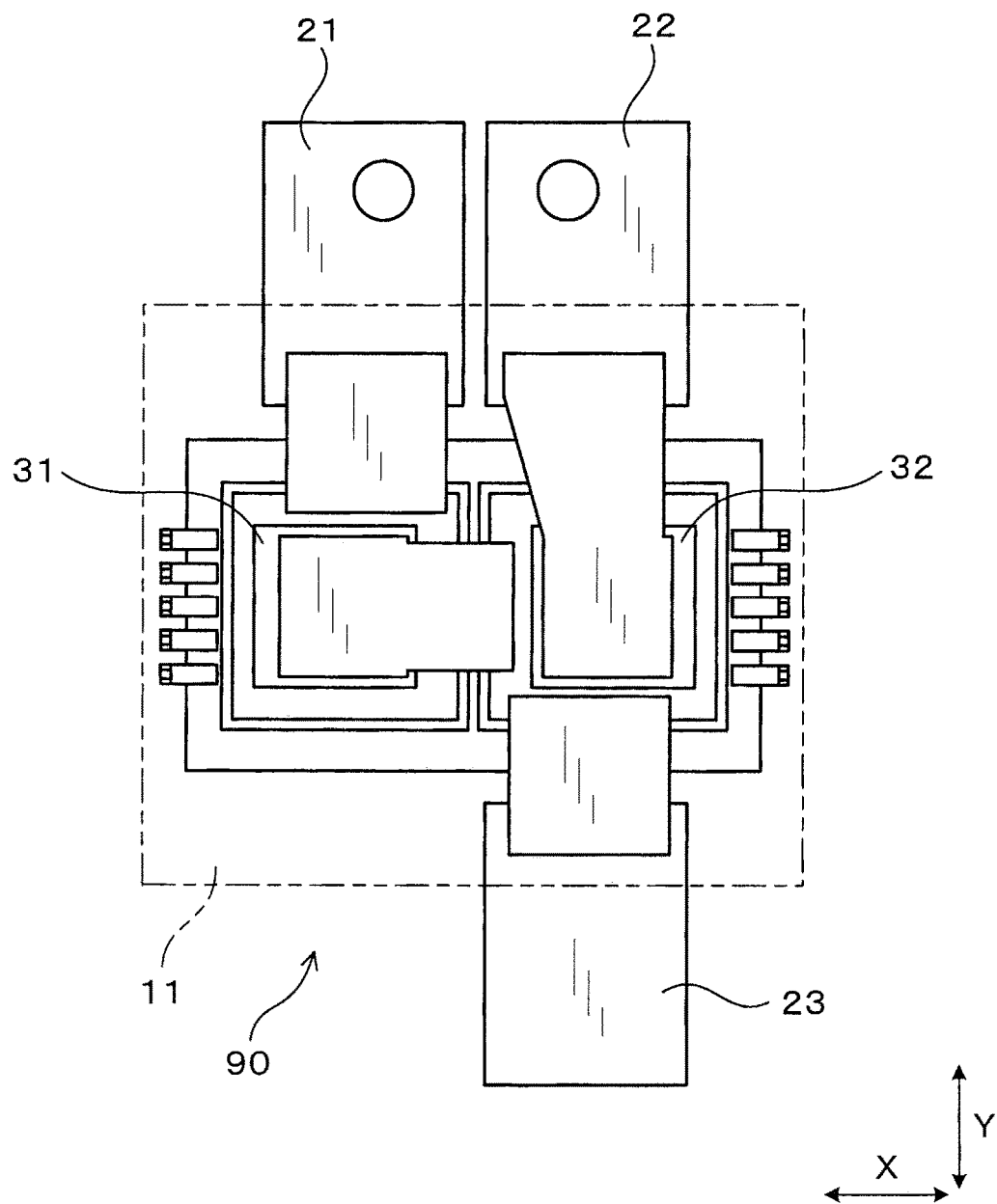
FIG. 21 shows a plan view of a semiconductor module in a comparative embodiment.
Figure 22:
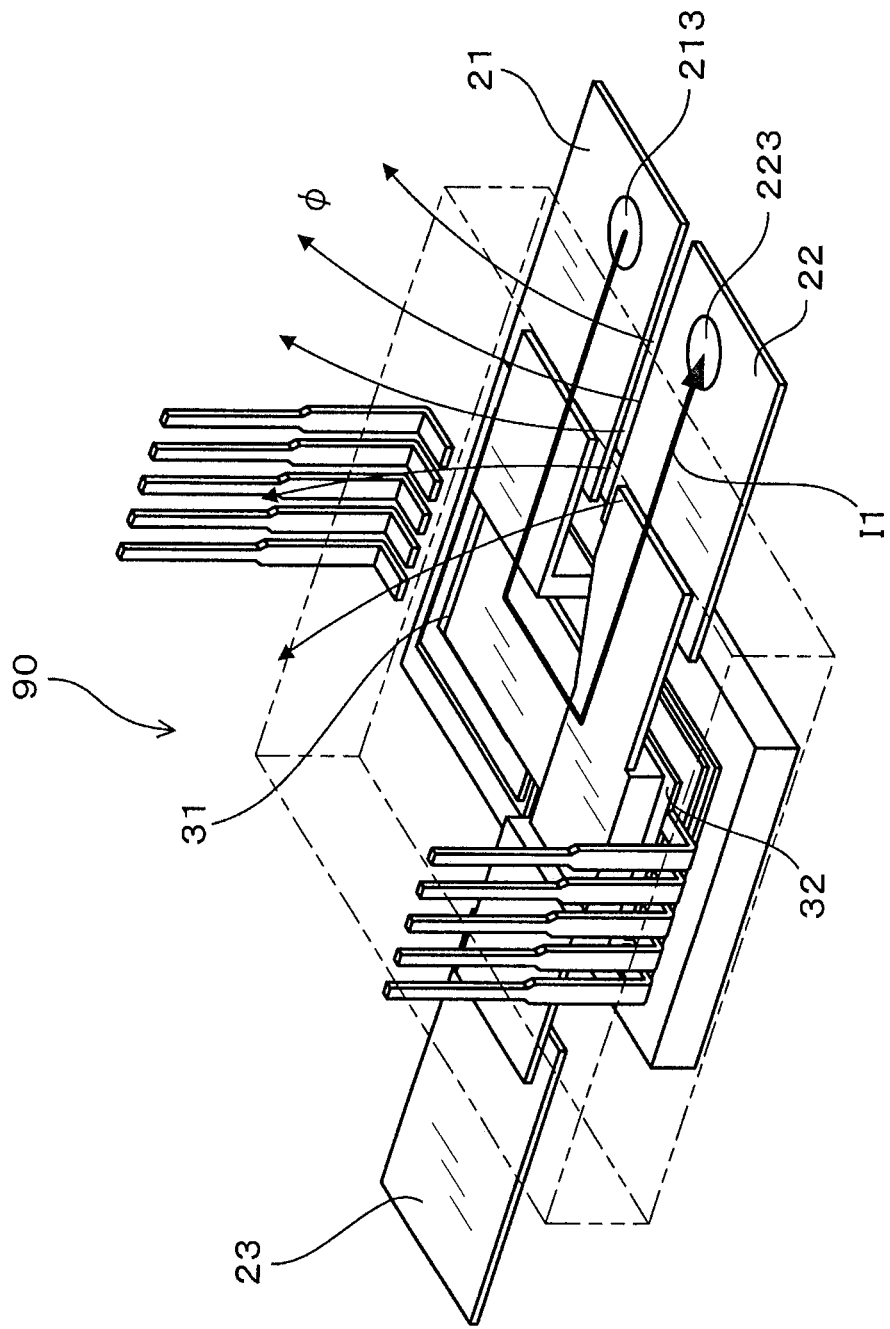
FIG. 22 shows a perspective view of the semiconductor module in the comparative embodiment.

An electric power converter of the comparative embodiment has three semiconductor modules 90 shown in FIGS. 21 and 22.

The semiconductor module 90 is the same as the semiconductor module 10 in the electric power converter 1 of the first embodiment except that a counter conductor is not provided.

In the electric power converter according to the comparative embodiment, when an alternating current I1 flows through an alternating current path, a magnetic flux $\varphi$ is generated so as to penetrate inside the alternating current path.

This generated magnetic flux $\varphi$ affects surrounding electronic components and electronic devices.

Further, as the generated magnetic flux $\varphi$ increases, a surge voltage generated increases.

Therefore, in the first embodiment, etc., the counter conductor 4 is disposed at an appropriate position so as to cancel the generated magnetic flux $\varphi$.

Figure 23:
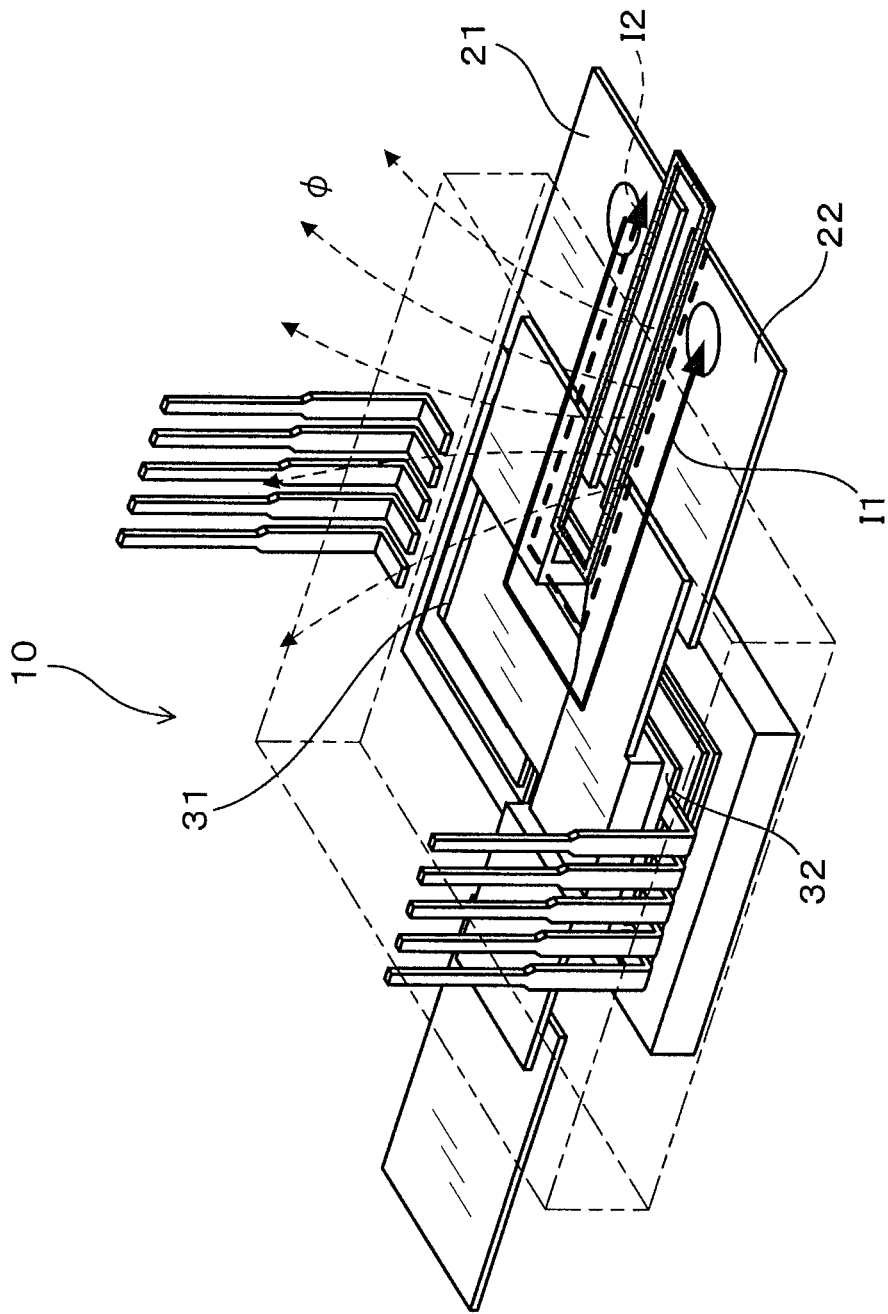
FIG. 23 shows a perspective view showing operations and effects of the semiconductor module in the first embodiment.

That is, as shown in FIG. 23, a current I2 flows through the counter conductor 4 in a direction opposite to the alternating current I1 by disposing the counter conductor 4 to face the alternating current path.

As a result, the generated magnetic flux $\varphi$ is weakened.

That is, the parasitic inductance in the alternating current path is suppressed from being generated by providing the counter conductor 4.

EXPERIMENTAL EXAMPLE 1

A magnitude of the parasitic inductance in the alternating current path of the electric power converters according to the first, second and third embodiments, and the electric power converter according to the comparative example have been compared by using a simulation.

The electric power converters according to the first, second and third embodiments are defined as samples 1, 2, and 3, respectively, and the electric power converter according to the comparative example is defined as a sample 10.

In the samples 1, 2, 3, a distance in the Z direction between the counter conductor 4 and the positive electrode terminal 21 and the negative electrode terminal 22 are equal, and are set to about 1.0 mm.

The thickness of the counter conductor 4 in the Z direction is set to 0.2 mm and the conductor width is set to 0.5mm.

The simulation was performed using a three-dimensional boundary element method.

Moreover, the frequency of the alternating current was set to 100 kHz in the present simulation.

As a result of the simulation, the following data was obtained as the parasitic inductance of the alternating current path.

That is, the parasitic inductance of the alternating current path was 10.8 nH in sample 1, 10.4 nH in sample 2, 9.7 nH in sample 3, and 12.5 nH in sample 10.

From the above results, it is understood that the parasitic inductance of the alternating current path can be suppressed from being generated by providing the counter conductor 4 as in the first to third embodiments.

It is also understood that the effect of suppressing the parasitic inductance from being generated can be further improved by disposing the counter conductor 4 on both the upper and lower sides of the alternating current path as in the third embodiment.

EXPERIMENTAL EXAMPLE 2

Next, a magnitude of the parasitic inductance in the alternating current path the electric power converters according to the third, fourth, fifth, sixth and seventh embodiments, and the electric power converter according to the comparative example have been compared by using a simulation.

The electric power converters according to the fourth, fifth, sixth and seventh embodiments are defined as samples 4, 5, 6, and 7, respectively.

Even in the samples 4, 5, 6, and 7, the distance between the counter conductor 4 and the positive electrode terminal 21 and the negative electrode terminal 22 are equal to that of the above-described sample 3.

The thickness of the counter conductor 4 in the Z direction is also the same as that of the sample 3.

The conductor width of the counter conductor 4 for samples 4, 5, and 6 is the same as that of the sample 1, however, the conductor width of the counter conductor 4 in the sample 7 is set to 3.0 mm.

The simulation method and conditions are the same as in the Experimental Example 1.

As a result of the simulation, the following data was obtained as the parasitic inductance of the alternating current path.

That is, the parasitic inductance of the alternating current path was 10.7 nH in sample 3, 10.9 nH in sample 4, 8.6 nH in sample 6, and 6.5 nH in sample 7.

From the above results, it is possible to sufficiently suppress the parasitic inductance from being generated in the alternating current path in any of the samples 3 to 7, as compared with the sample 10.

It was also confirmed that the parasitic inductance can be more effectively suppressed from being generated by disposing the counter conductor 4 more precisely along the path in which the current concentrates particularly in the alternating current path as in the samples 6 and 7.

The present disclosure is not limited to the above-described embodiments, but can be applied to various embodiments without departing from the scope thereof.

For example, it is possible to combine the second embodiment or the third embodiment with any one of the fourth to eighth embodiments.

Further, the shape of the counter conductor is not particularly limited, and it may not be necessarily a loop shape.

What is claimed is:

1. An electric power converter comprising:
a positive electrode terminal and a negative electrode terminal disposed parallel and adjacent to each other;
a positive electrode side switching device connected to the positive electrode terminal;
a negative electrode side switching device connected to the negative electrode terminal;
an output terminal connected to a connection point between the positive electrode side switching device and the negative electrode side switching device; and
a counter conductor facing at least a portion of the positive electrode terminal and at least a portion of the negative electrode terminal in a height direction, the height direction being a direction perpendicular to both an aligned direction and a protruding direction of the positive electrode terminal and the negative electrode terminal, wherein
the counter conductor is disposed along a current path of an alternating current flowing through the positive electrode terminal, the positive electrode side switching device, the negative electrode side switching device, and the negative electrode terminal,
an inner edge of the positive electrode terminal is spaced from and adjacent to an inner edge of the negative electrode terminal in the aligned direction,
a plurality of conductor plates respectively interconnect (i) the positive electrode terminal to the positive electrode side switching device, (ii) the negative electrode terminal to the negative electrode side switching device, and (iii) the positive electrode side switching device to the negative electrode side switching device, and
the counter conductor has a shape matching a disposition shape of the inner edges of the positive and negative electrode terminals and edges of the plurality of conductor plates as viewed from the height direction.

2. The electric power converter according to claim 1, wherein
the positive electrode terminal is a first metal plate and the negative electrode terminal is a second metal plate, the first and second metal plates are disposed such that a thickness direction of the first and second metal plates extends in the height direction; and
the counter conductor has portions along the inner edges of the positive electrode terminal and the negative electrode terminal which are adjacent to each other.

3. The electric power converter according to claim 1, wherein
the counter conductor is formed in a loop shape.

4. The electric power converter according to claim 1, wherein
the counter conductor is disposed on one side in the height direction of the positive electrode terminal and the negative electrode terminal.

5. The electric power converter according to claim 1, wherein
the counter conductor is disposed on both sides in the height direction of the positive electrode terminal and the negative electrode terminal.

6. The electric power converter according to claim 1, wherein
the electric power converter further includes a circuit board having a control circuit for controlling the positive electrode side switching device and the negative electrode side switching device; and
the counter conductor is formed on the circuit board.

7. The electric power converter according to claim 1, wherein
the positive electrode terminal, the negative electrode terminal, the positive electrode side switching device, the negative electrode side switching device, and the output terminal constitute a semiconductor module that is integrated together with a mold resin; and
the counter conductor is held in the mold resin.

* * * * *